US006352436B1

(12) United States Patent
Howard

(10) Patent No.: US 6,352,436 B1
(45) Date of Patent: Mar. 5, 2002

(54) SELF RETAINED PRESSURE CONNECTION

(75) Inventor: William E. Howard, Richmond, VT (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/607,577

(22) Filed: Jun. 29, 2000

(51) Int. Cl.$^7$ ............................................... H01R 12/00
(52) U.S. Cl. ............................ 439/82; 439/751; 439/71
(58) Field of Search ............................. 439/82, 55, 65, 439/66, 74, 75, 81, 70, 71, 268, 891, 876, 751, 78, 289, 290, 943, 857

(56) References Cited

U.S. PATENT DOCUMENTS

| | | | | |
|---|---|---|---|---|
| 3,820,061 A | * | 6/1974 | Holden | 439/62 |
| 4,030,792 A | * | 6/1977 | Fuerst | 439/65 |
| 4,555,151 A | * | 11/1985 | Neese et al. | 439/82 |
| 5,073,118 A | * | 12/1991 | Grabbe et al. | 439/82 |
| 5,152,695 A | | 10/1992 | Grabbe et al. | 439/71 |
| 5,228,861 A | | 7/1993 | Grabbe | 439/66 |
| 5,374,204 A | * | 12/1994 | Foley et al. | 439/82 |
| 5,704,793 A | | 1/1998 | Stokoe et al. | 439/62 |
| 5,892,280 A | * | 4/1999 | Crane, Jr. et al. | 439/65 |
| 6,010,342 A | * | 1/2000 | Watson | 439/78 |

OTHER PUBLICATIONS

D.G. Grabbe and H. Merkelo, "High Density Electronic Connector (Micro Interposer) for High Speed Digital Applications" AMP Journal of Technology vol. 1 Nov., 1991, pp. 80–90.

D.G. Grabbe, H. Merkelo and R. Pryputniewicz, "Project AMPSTAR Connector", AMP Journal of Technology vol. 2 Nov., 1992, pp. 4–13.

Thomas & Betts "Board–to–Board MPI Connector" product sheet (no date provided).

Thomas & Betts "Board–to–Backplane MPI Connector" product sheet (no date provided).

Thomas & Betts "Chip–to–Board MPI/LGA Socket" product sheet (no date provided).

* cited by examiner

Primary Examiner—Tho D. Ta
(74) Attorney, Agent, or Firm—Teradyne Legal Dept.

(57) ABSTRACT

A self retained pressure connector is provided that includes a spring action contact surface at a first end and a compliant interference fit contact surface at a second end. The compliant interference fit contact is supported within a conductive hole in a printed circuit board and the spring action surface contact provides an electrical connection to a conductive element disposed on a second surface. The conductive element may, in alternate embodiments, be a surface pad on the second surface or a second self retained pressure connector rotated ninety degrees from the first self retained pressure connector. A differential self retained pressure connection is also described in which a dielectric material is used to electrically isolate a first half of the connector from a second half of the connector.

21 Claims, 16 Drawing Sheets

SELF RETAINED PRESSURE CONNECTION

BACKGROUND OF THE INVENTION

Electrical connectors are used in many electronic systems. It is generally easier and more cost effective to manufacture a system on several printed circuit boards or substrates which are joined together with electrical connectors than it is to manufacture a single, very complex circuit board to provide the desired system functionality.

Where two circuits, each positioned on a different printed circuit board or substrate, are intended to be connected using surface pads, various structures in the form of pressure connection members have been used. These interconnect members are often molded into an elastomer or rigid cavity pad. The elastomer or rigid cavity pad provides support and alignment, a means for attachment to the substrate, and protection from the environment before the connection is made.

These pressure mounted interconnect members and support structures are sandwiched between parallel substrate surfaces and force is applied, roughly perpendicular to the substrates, to make the connection between the electrical circuits. The perpendicular force direction is generally desirable for easy assembly of one substrate to another.

The interconnect members typically contact a pad on the surface of the substrate. The signals pass from these surface pads through vias to inner layer trace constructions. Interconnect structures using the central portion of a pad to facilitate contact, typically require the surface pads to be attached to via pads to make the connection to an inner layer. Thus, two pads are required to make the connection.

SUMMARY OF THE INVENTION

One drawback of the above described approach is that using a supporting structure to organize interconnect members and secure them to the substrate generally adds additional cost and manufacturing complexity to the interconnect system. This complexity is passed on to all different sized configurations of the supporting structure. That is, each different configuration would typically require a unique supporting structure design adding further complexity to supporting a family of interconnect systems.

An additional drawback is that oxides and other debris often accumulate on the contact surfaces of these interconnection structures. This oxidation and debris can often prove an obstacle to establishing a reliable connection.

A further drawback is the requirement of two pads on the substrate to make a single connection. This dual pad approach uses excessive surface area in an area where real estate is generally at a premium. Moreover, the additional pad can also be a source of additional capacitance and negatively affect the signal quality as it passes through that portion of the circuit.

In accordance with one embodiment of the present invention, a conductive member for providing an electrical connection between two conductive surfaces is provided. The conductive member includes a spring action contact surface at a first end and a compliant interference fit contact surface at a second end. With such an arrangement a need for a supporting structure for the conductive members is eliminated thus providing a less complicated connector solution which is easily manufactured at a lower cost.

In accordance with a second embodiment of the present invention, a dielectric material is used to electrically isolate a first half of the connector from a second half of the connector. With such an arrangement, a differential signal may be transferred through the connector.

In accordance with a third embodiment of the connector, the compliant interference fit contact is supported within a conductive hole in a printed circuit board and the spring action surface contact provides an electrical connection to a conductive element disposed on a second surface. With such an arrangement, a mechanical wiping action against the conductive element is provided which facilitates breaking through oxides that develop on the conductive element and further for clearing minute debris from the actual mated zone that passes the electrical signal from the pad on the substrate to a portion of the interconnection structure, thus providing a more reliable connection.

In accordance with a fourth embodiment of the present invention, an interconnection system between a printed circuit board and a second surface is provided. The interconnection system includes an arrangement of conductive elements disposed on said second surface and an arrangement of first electrical connectors. Each of the electrical connectors includes a compliant interference fit contact disposed at a first end of the connector, the compliant interference fit contact being supported within a conductive hole in the printed circuit board. Each electrical connector further includes a spring action surface contact disposed at a second end of the connector, the spring action surface contact providing an electrical connection to one of the conductive elements. With such an arrangement, only a single surface pad is required by the interconnect solution, thus minimizing the capacitance of the connection. In addition, a flexible interconnection system is provided in which signals may be passed from one circuit substrate to another circuit substrate at multiple locations on each substrate rather than in a traditional grouping of signal interconnects at a single area of the substrate.

BRIEF DESCRIPTION OF THE DRAWINGS

The foregoing and other objects, features and advantages of the invention will be apparent from the following more particular description of a Self Retained Pressure Connection, as illustrated in the accompanying drawings in which like reference characters refer to the same parts throughout the different views. For clarity and ease of description, the drawings are not necessarily to scale, emphasis instead being placed upon illustrating the principles of the invention.

DETAILED DESCRIPTION OF THE INVENTION

Figure 1:
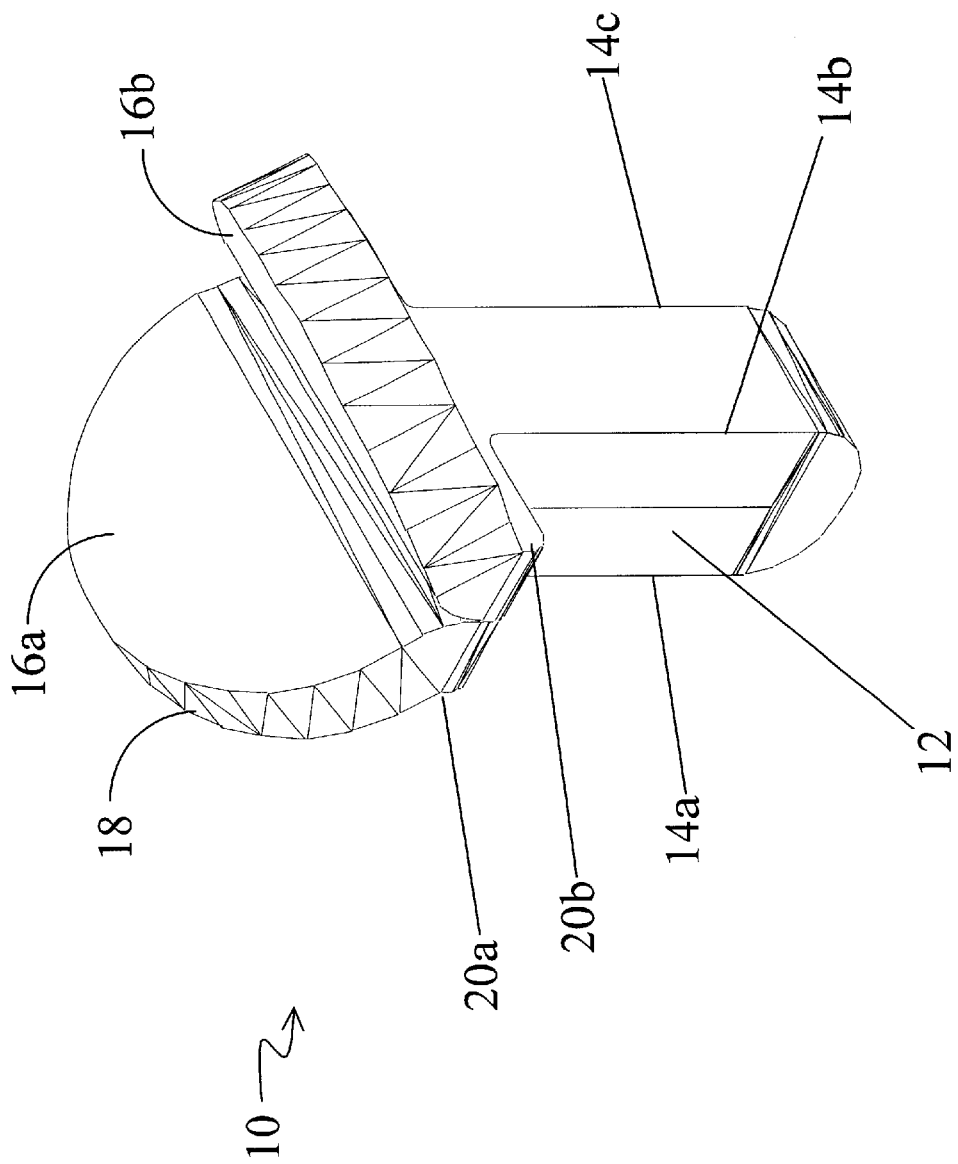
FIG. 1 is an illustration of a self retained pressure connector according to one embodiment of the invention.

Referring to FIG. 1, a self retained pressure connector 10 is shown to include an insertion element 12 at a first end and multiple surface contacts 16a, 16b, here, two, at a second end. The insertion element 12 includes a plurality of contact surfaces 14a–14c (14d is hidden) which provide an electrical contact between the self retained pressure connector 10 and a plated through hole (not shown) when the insertion element 12 is inserted into the plated through hole.

The surface contacts 16a, 16b include an edge 18 which, in one embodiment, is coined. The surface contacts 16a, 16b are formed to provide a spring action when a downward force is applied against the surface contacts 16a, 16b. To provide such a spring action, the self retained pressure connector 10 is further shown to include a bend 20a, 20b between the insertion element 12 and the surface contacts 16a, 16b.

Specifically, when such a downward force is applied, an angle of each bend 20a, 20b measured with respect to a plane drawn perpendicular to the insertion element 12, is reduced to enable the spring action.

Figure 2:
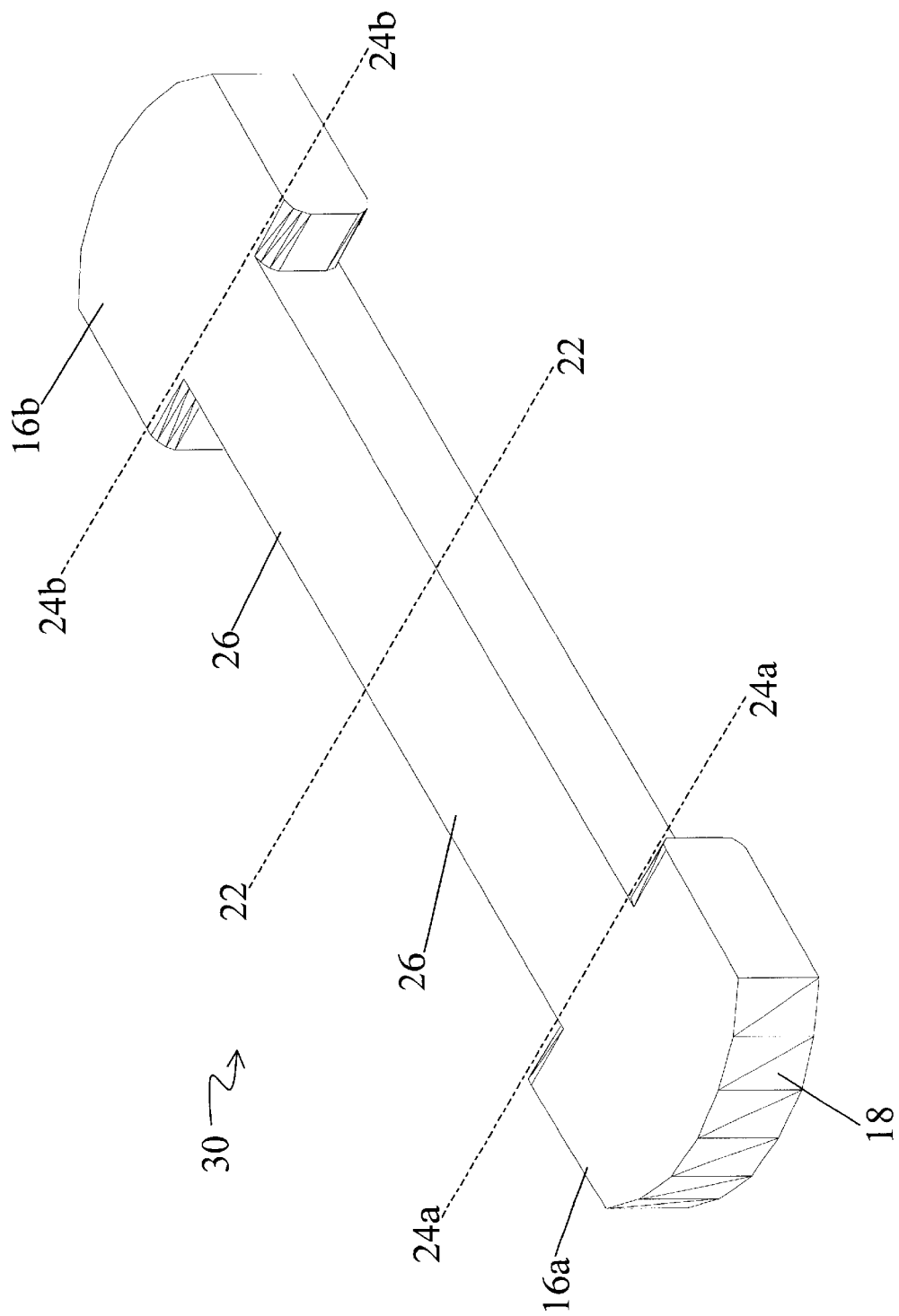
FIG. 2 is a blank from which one embodiment of a self retained pressure connector is formed.

Referring now to FIG. 2, a blank 30 from which a self retained pressure connector may be formed is shown. The blank 30 is typically fashioned from a high strength, conductive material. Specifically, the material used should have suitable spring characteristics to provide the desired spring force at the surface contacts 16a, 16b. In addition, the material should provide a conductivity typical of dry circuit connections in the miliamp range.

The blank 30 may be formed or stamped from a sheet of conductive material. The dimensions of the sheet are sized appropriately for the desired plated through hole size. The blank 30 is folded in half at line 22 to form the insertion element 12. When folded, an inner surface 26 of the blank 30 is pressed against itself.

The blank 30 is also bent at lines 24a and 24b to provide the angular presentation of the surface contacts 16a, 16b. Again, as stated above, the surface contacts 16a, 16b are formed at an angle from the insertion element 12 so that they may provide a spring force. To provide the desired spring force, the surface contacts 16a, 16b may be bent at an appropriate angle and provided with appropriate geometry to accommodate the bending stresses achieved upon mating.

It will be appreciated by those of ordinary skill in the art that the particular shape of the surface contacts 16a, 16b may be varied somewhat while still providing the benefits described herein. Here, the surface contacts 16a, 16b are shown as rectangular with an arcuate distal edge rather than the semi-circular shape depicted in FIG. 1. Other shapes for the surface contacts 16a, 16b may also be contemplated. For example, the semi-circular shape depicted in FIG. 1 may be modified by removing elliptical sections on either side of the surface contacts 16a, 16b.

Figure 3:
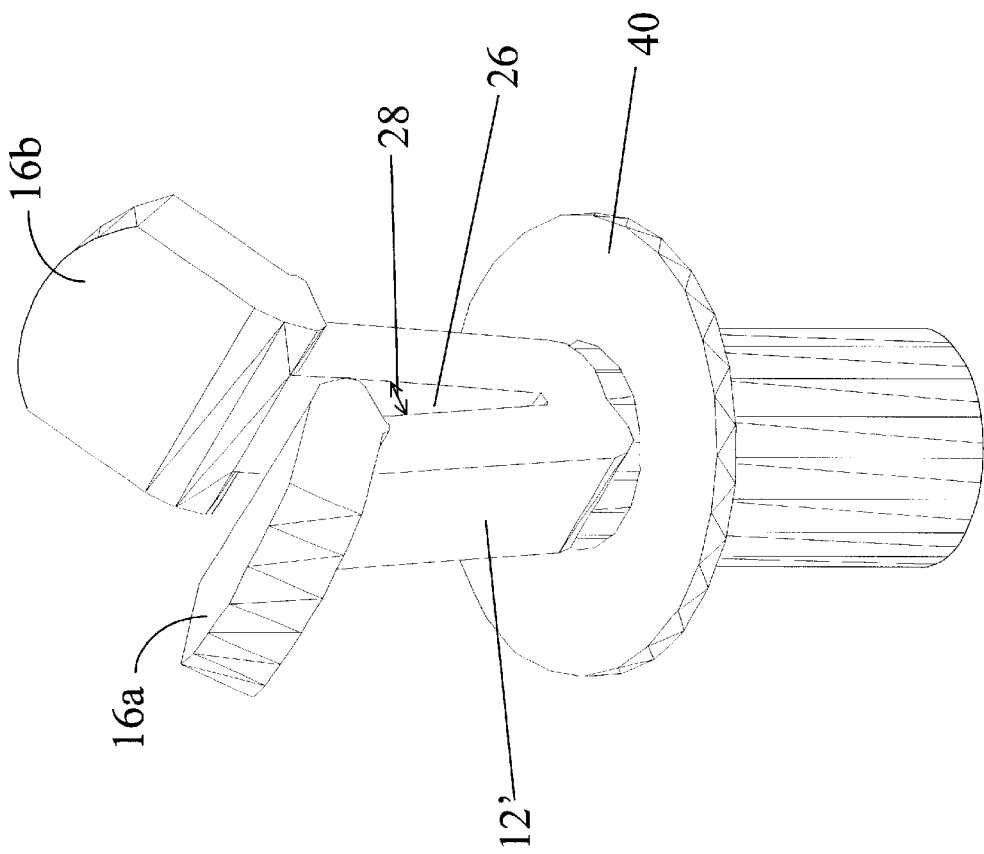
FIG. 3 is an illustration of one embodiment of an insertion process for the self retained pressure connector of FIG. 1.

An alternate embodiment of the insertion element 12' is depicted in FIG. 3. Here, the initial fold at line 22 does not completely press the inner surface 26 of the blank 30 against itself, but rather, leaves a small gap 28. When the connector 10 is pressed into a plated through hole 40, the gap 28 is forced closed, thus providing the compliant retention necessary to retain the connector 10 in the plated through hole 40.

Figure 4:
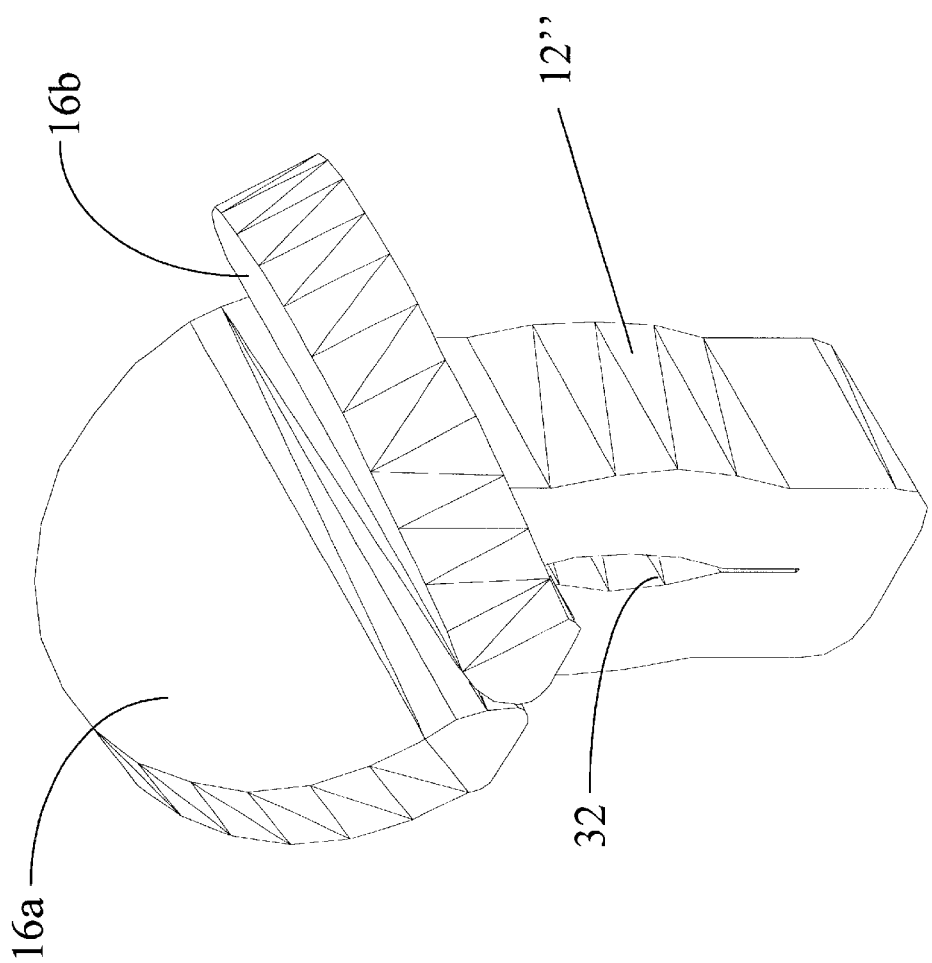
FIG. 4 is an alternate embodiment of the insertion element of the self retained pressure connector of FIG. 1.

A second alternate embodiment of the insertion element 12" is depicted in FIG. 4 in which an "eye of the needle" type compliant 32 is formed in the insertion element 12. Here, the eye of the needle compliant 32 provides the necessary compliant retention when the connector 10 is inserted into a plated through hole.

Figure 5:
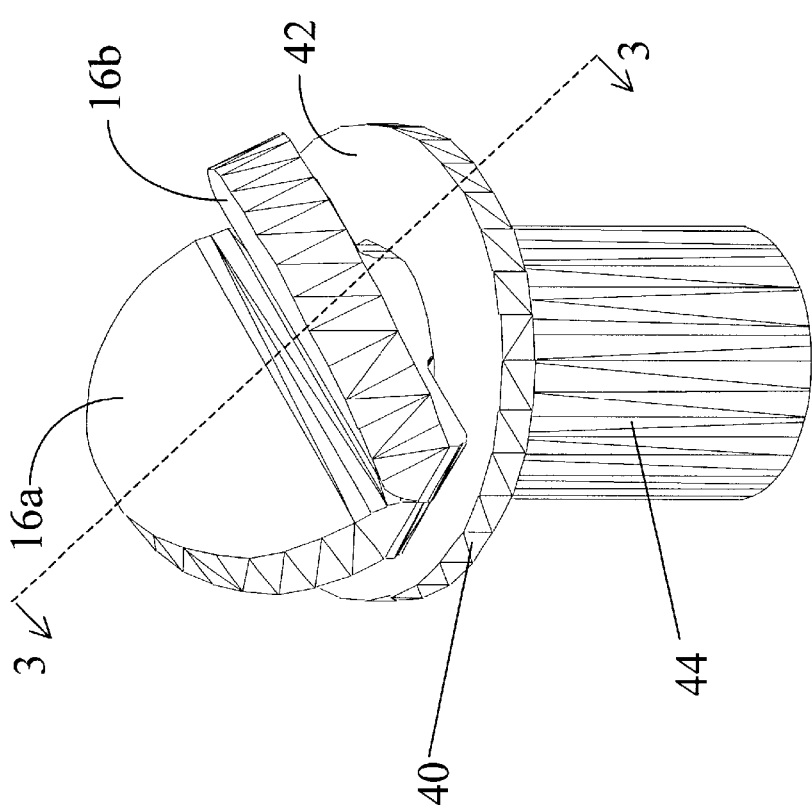
FIG. 5 is an illustration of the self retained pressure connector of FIG. 1 inserted into a plated through hole.
Figure 6:
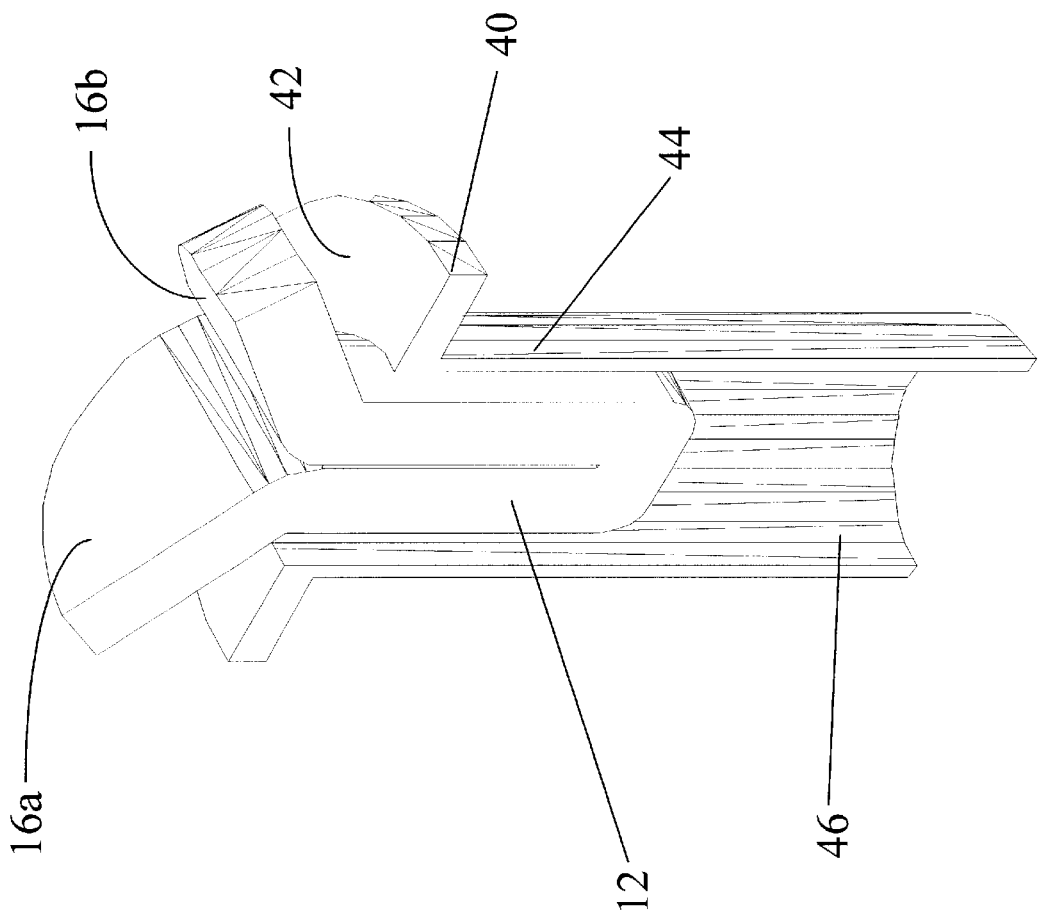
FIG. 6 is a cross sectional diagram taken across the line 3—3 of FIG. 5.

Referring now to FIGS. 5 and 6, the self retained pressure connector 10 of FIG. 1 is shown inserted into a plated through hole 40. Plated through holes, also referred to as vias, are conventionally formed by drilling or otherwise providing a hole through a printed circuit board. The hole is located such that it pierces through each conductive signal layer trace it is intended to connect. The resulting hole is then plated to provide an electrical connection between each of the conductive traces.

Here, the plated through hole 40 includes a surface pad 42 and a barrel portion 44. The barrel portion 44 extends into the printed circuit board (not shown) and typically connects with one or more signal traces (not shown) each located on one of a plurality of layers which comprise the printed circuit board as described above.

Here, it may be seen that the surface contacts 16a, 16b of the connector 10 extend above the surface pad 42 of the plated through hole 40. The insertion element is lodged within the plated through hole 40, providing a compliant interference fit within the barrel portion 44 as the insertion element contact surfaces 14a–14d (FIG. 1) contact an inner wall 46 (FIG. 6) of the plated through hole 40. This contact between the contact surfaces 14a–14d and the inner wall 46 of the plated through hole 40 provide the electrical connectivity between the self retained pressure connector 10 and the plated through hole 40 and signal trace.

Plated through holes are traditionally used to connect a signal from an inner layer of a circuit board to an external device. In one embodiment, a plurality of self retained pressure connectors are used to connect a plurality of electrical signals propagating along signal traces in a first circuit board to a destination external to the printed circuit board.

Figure 7:
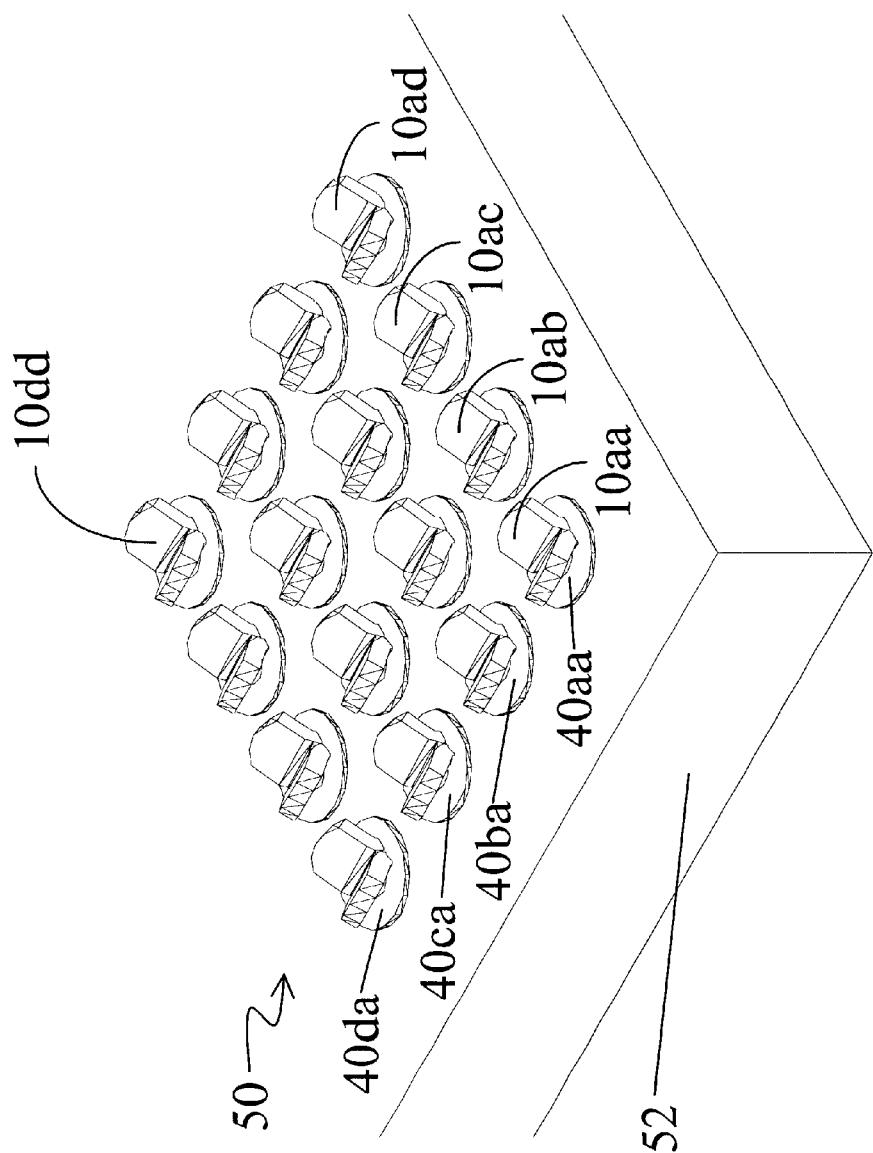
FIG. 7 depicts an array of the self retained pressure connector of FIG. 1.

Referring now to FIG. 7, an array 50 of self retained pressure connectors 10aa–10dd is shown inserted into an array of plated through holes 40aa–40dd in a circuit board 52. Here, the array 50 is shown to include sixteen self retained pressure connectors 10aa–10dd however, the number and particular arrangement of the connectors 10aa–10dd shown is for illustrative purposes only. The specific requirements of an application will drive the arrangement and quantity details.

For instance, it will be appreciated by those of ordinary skill in the art that a requirement of grouping the signal contacts in a single area on a circuit board so that they may be held by a supporting structure is eliminated as no supporting structure is required by the self retained pressure connectors. As a result, signal contacts may be located on various areas of the board as may be best suited to the particular application.

In this configuration, sixteen single-ended electrical signals are transferred through the self retained pressure connectors 10aa–10dd. These signals are transferred through the array 50 to conductive elements located on a second surface. Because the connectors 10aa–10dd are inserted into plated through holes, a need for a stand alone surface pad on the circuit board is eliminated.

Figure 8:
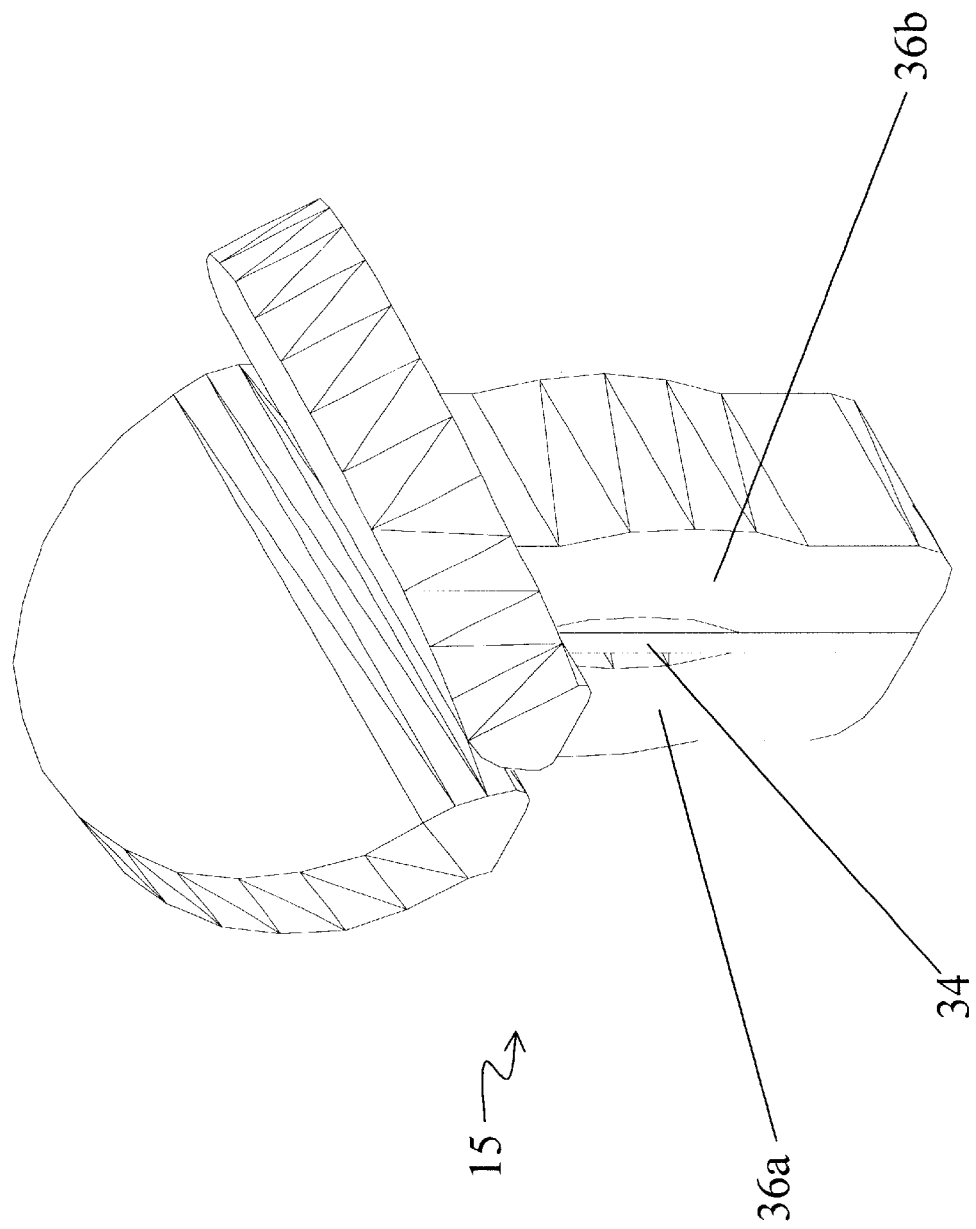
FIG. 8 is a differential signal embodiment of a self retained pressure connector.

This configuration may also be used to transfer sixteen differential electrical signals. Referring now to FIG. 8, a differential embodiment 15 of the self retained pressure connector is shown to include a sheet of dielectric material 34 laminated between two halves 36a, 36b of the connector 15, thus electrically isolating each half 36a, 36b from the other. The two halves may also be electrically isolated from each other by means of a molding operation or other means to provide an amount of dielectric material between the two halves.

This differential connector may be inserted into a multi-connection via in a printed circuit board configured to transfer differential signals such as is described in application Ser. No. 09/360,002, filed Jul. 23, 1999 entitled Multi-Connection Via having named inventor Sepehr Kiani which is hereby incorporated by reference in its entirety.

Referring back to FIG. 7, here, the self retained pressure connectors 10aa–10dd are shown aligned uniformly, that is, with the first surface contact 16a of each connector 10aa–10dd in a column aligned in a first plane and the second surface contact 16b aligned in a second plane. Depending upon the nature of the second surface however this uniform alignment of the connectors 10aa–10dd may not be necessary. This particular beneficial characteristic of the self retained pressure connectors 10aa–10dd will be discussed in further detail with respect to FIGS. 9 and 11.

Although the number, pattern, dimension and spacing of the self retained pressure connectors 10aa–10dd within the array 50 is not critical, it will be appreciated by those of ordinary skill in the art that in order to satisfy typical modern electrical system requirements, preferably, the contacts are spaced relatively close together and are no larger than is necessary to meet signal quality requirements of the particular application. As one example, the connectors 10 can be placed on a 1 mm×1 mm grid. Such a spacing would provide a single signal density of 625 signals per square inch.

Figure 9:
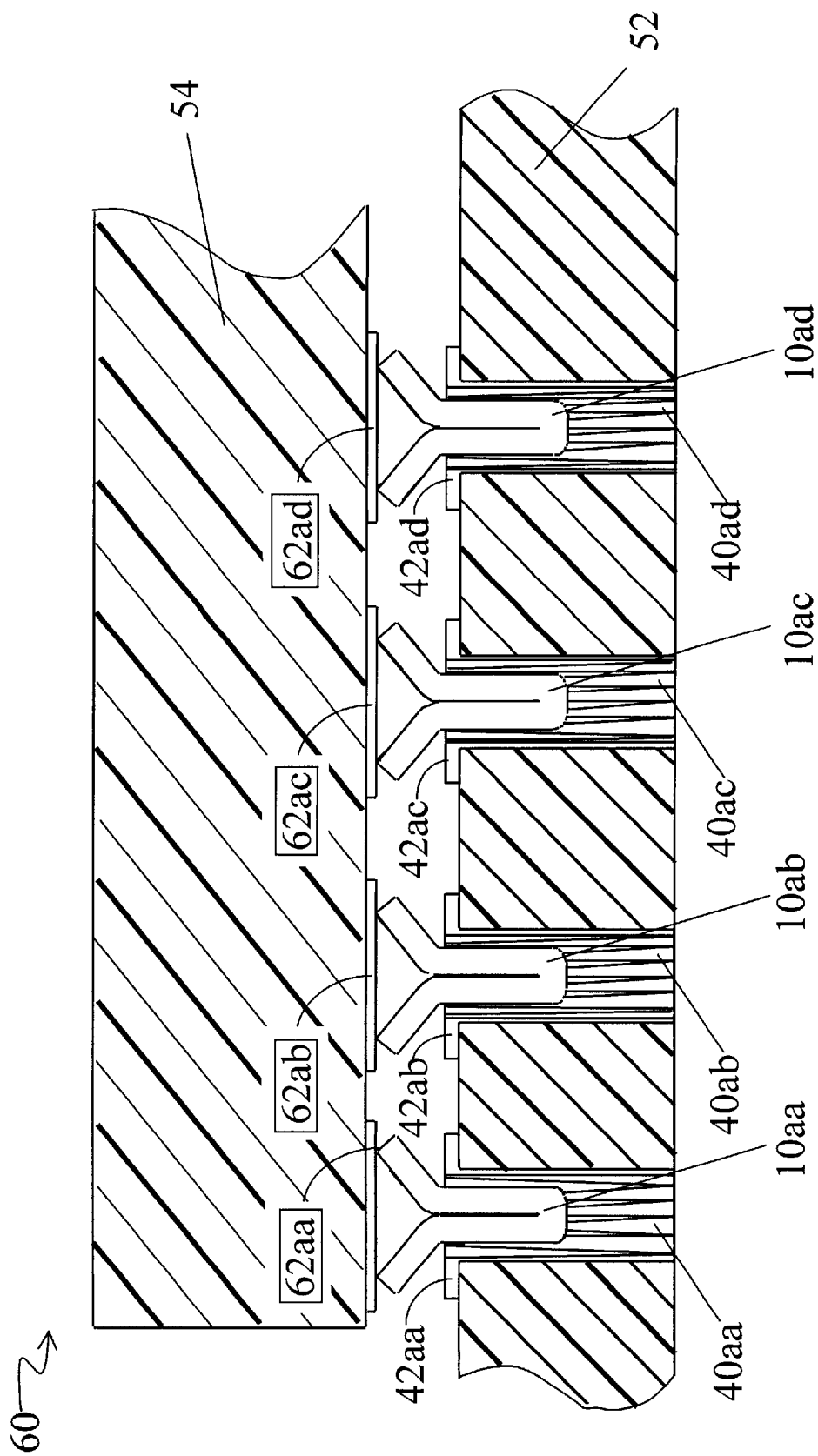
FIG. 9 is a cross sectional diagram of a mating arrangement between the array of self retained pressure connectors of FIG. 8 and a circuit substrate.

Referring now to FIG. 9, a cross sectional view of a mating arrangement 60 between the array 50 of self retained pressure connectors 10aa–10ad and a circuit substrate 54 is shown. Each self retained pressure connector 10aa–10ad is shown inserted into a plated through hole 40aa–40ad in a printed circuit board 52. On an upper surface of the printed circuit board 52 each plated through hole 40aa–40ad includes a surface pad 42aa–42ad. The surface contacts 16a, 16b of each self retained pressure connector 10aa–10ad extend diagonally outward from the center of the plated through hole 40aa–40ad above the corresponding through hole surface pad 42aa–42ad.

Provided on a lower contact surface of the circuit substrate 54 are an array of surface pads, only a first row 62aa–62ad of which are visible. These surface pads 62aa–62dd are provided at a spacing identical to the spacing between the self retained pressure connectors 10aa–10dd in the array 50. Again, the number, pattern, dimensions and spacing of the surface pads 62aa–62dd can be varied, in concert with the self retained pressure connectors 10aa–10dd, in order to optimize the tradeoffs between connector requirements.

This mating arrangement 60 enables a single surface pad to be used rather than a more typical surface pad, via pad combination which are used in prior art configurations. The elimination of the second pad decreases the capacitance of the arrangement.

Figure 10B:
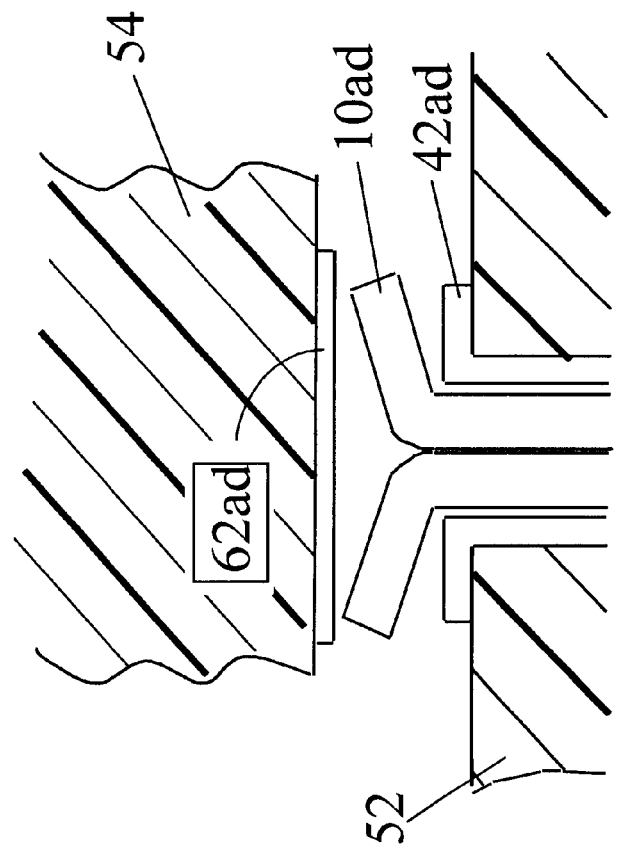
FIG. 10B is a cross sectional diagram of a mated pair of one of the self retained pressure connectors and a corresponding surface pad of FIG. 9.
Figure 10A:
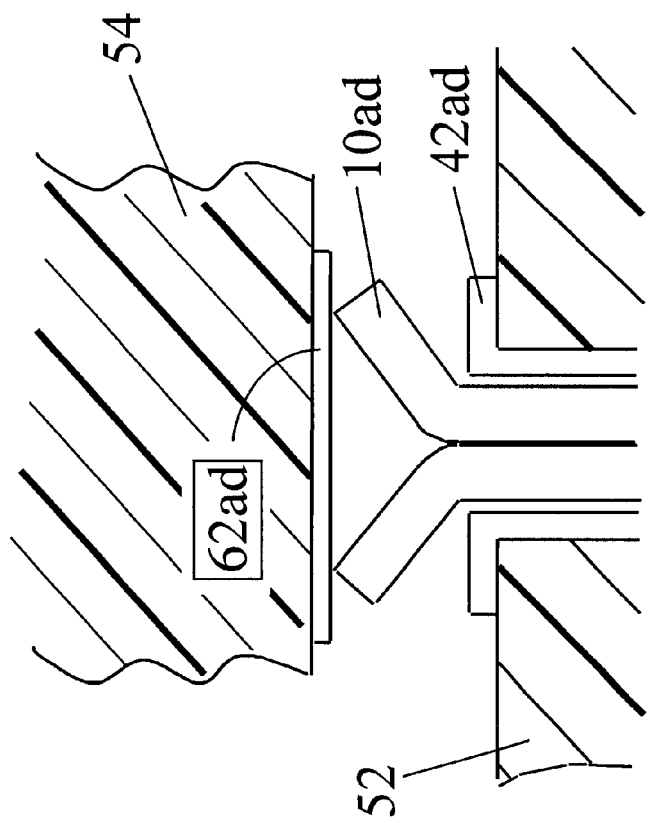
FIG. 10A is a cross sectional diagram of an unmated pair of one of the self retained pressure connectors and a corresponding surface pad of FIG. 9.

When opposing, perpendicular forces are applied against the circuit substrate 54 and the circuit board 52, pressure is applied to the surface contacts 16a, 16b of the self retained pressure connectors 10aa–10dd. This pressure causes the surface contacts 16a, 16b to flatten somewhat between the surface pads 62aa–62ad of the circuit substrate 54 and the surface pads 42aa–42ad of the plated through holes 40aa–40ad. This mated relationship between self retained pressure connector 10ad, the surface pad 62ad of the circuit substrate and the surface pad 42ad of the plated through hole 40ad is depicted in FIG. 10B in contrast to the unmated relationship depicted in FIG. 10A. This mated relationship of the various elements provides an electrical connection between the plated through hole 56aa–56ad and the surface pad 62aa–62ad of the electronics package 54, through the self retained pressure connectors 10aa–10dd. The dual surface contact arrangement of the connector 10 further provides multiple points of contact, thus providing a more reliable connection. Generally, alignment pins or other structural features (not shown) are used to guide the array 50 and surface pads 62aa–62dd together during mating. In addition, a blocking frame (not shown) may be provided around the contact array 50 to prevent overstress during mating.

As the surface contacts 16a, 16b are compressed when the circuit substrate 54 and the circuit board are pressed together, a wipe action is provided as the angle of the bend 20a,20b is reduced. This wipe can remove a layer of oxidation or other debris from the surface pads 62aa–62ad of the electronics package 54 thus enabling a better electrical connection between the self retained pressure connectors 10aa–10dd and the surface pads 62aa–62ad and increasing the reliability of the electrical connection making the connection less susceptible to intermittency.

It will be appreciated by those of ordinary skill in the art that this mating arrangement has been described as between a circuit substrate 54 and a circuit board, this arrangement would also include a mating arrangement between two circuit boards or a circuit board and an electronics package.

As mentioned previously, the alignment of the self retained pressure connectors 10aa–10dd to one another may be critical in certain mating configurations. Here, because the self retained pressure connectors 10aa–10dd are mating to a pad on the second surface, the orientation of one connector to a second connector in the array 50 is not critical for the described arrangement. As a result, an assembly process in which these self retained pressure connectors are pressed into a printed circuit board may be simplified in that orientation of the connector 10 need not be taken into account during insertion.

Figure 11:
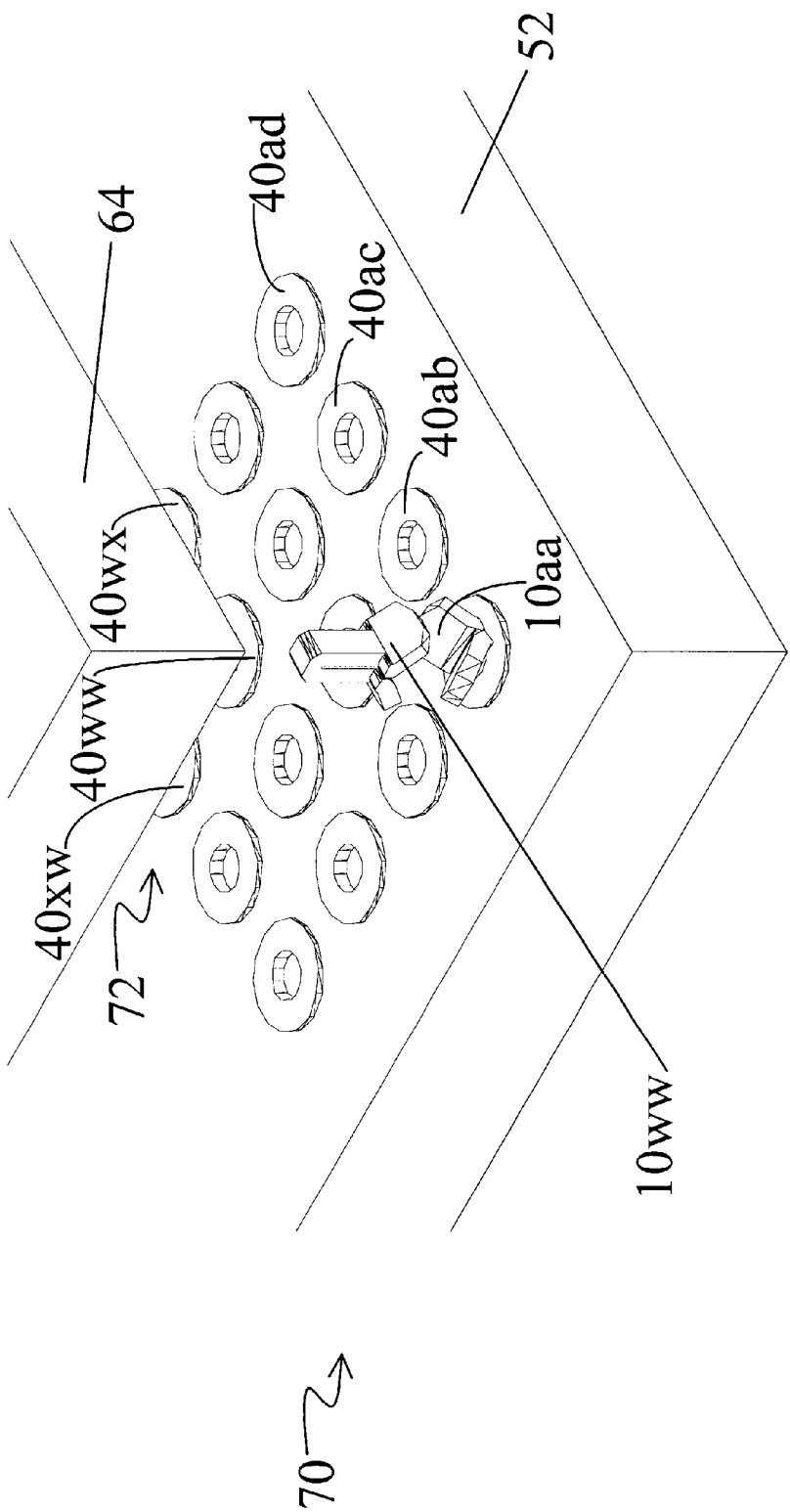
FIG. 11 depicts an alternate mating arrangement between the array of self retained pressure connectors and a second array of self retained pressure connectors.

FIG. 11 depicts an alternate mating arrangement 70 between the array 50 of self retained pressure connectors 10aa–10dd and a second array 72 of self retained pressure connectors 10ww–10zz in which the orientation of each connector is material to the mating arrangement 70. Here, for clarity and ease of description, only one self retained pressure connector 10aa, 10ww is shown from each array 50, 72.

The first array 50 of self retained pressure connectors 10aa–10dd is shown arranged in the first circuit board 52. A second circuit board 64 is further shown to house the second array 72 of self retained pressure connectors 10ww–10zz. The two circuit boards 52, 64 are arranged parallel to each other with the two arrays 50, 72 facing each other.

Figure 12B:
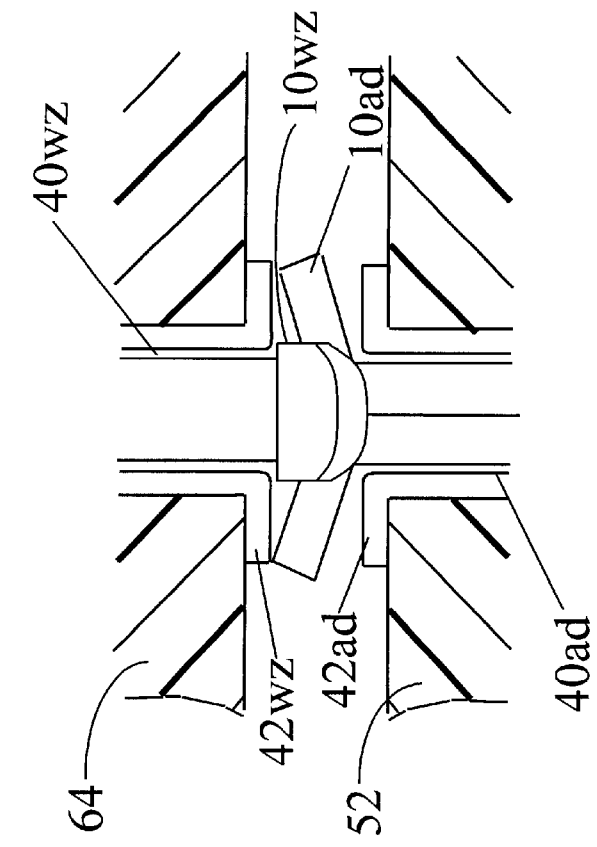
FIG. 12B is a cross sectional diagram of a mated pair of self retained pressure connectors of FIG. 11.
Figure 12A:
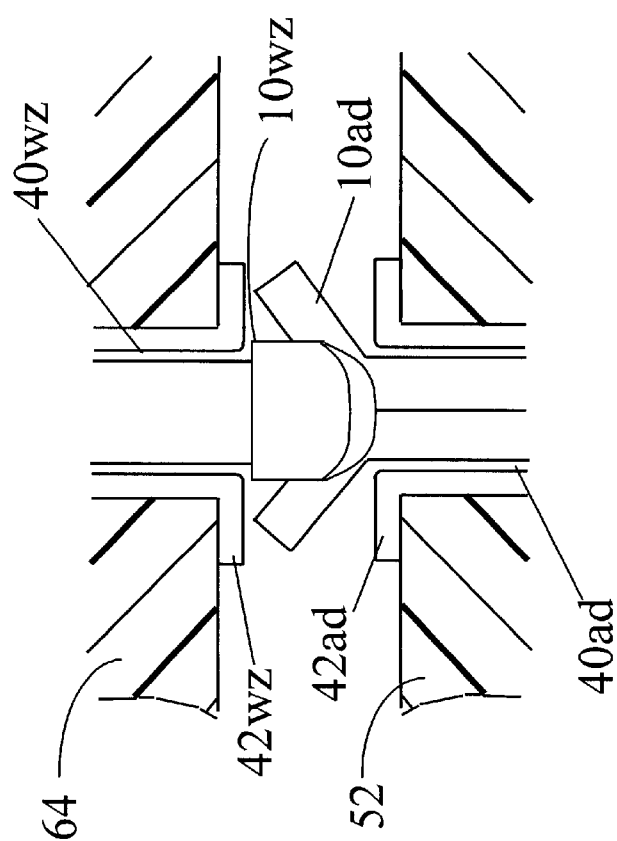
FIG. 12A is a cross sectional diagram of an unmated pair of self retained pressure connectors of FIG. 11.

The self retained pressure connector 10ww of the second array 72 is rotated 90 degrees from the self retained pressure connector 10aa of the first array 50. When mated, the surface contacts 16a, 16b of each self retained pressure connector 10aa, 10ww flatten somewhat and are positioned in-between the surface contacts 16a, 16b of the mating self retained pressure connector 10aa, 10ww as ideally shown in FIG. 12B as opposed to the unmated relationship between the various elements depicted in FIG. 12A. Again, alignment pins or other structural features (not shown) would generally be used to guide the two arrays 50, 72 together during mating so that each individual self retained pressure connector aligns properly with its mating connector of the opposing array 50, 72.

Due to the nature of the mating interface, the orientation of each self retained pressure connector 10aa–10dd, 10ww–10zz is material to the reliability of the mating arrangement 70. As mentioned above, in each mating pair of self retained pressure connectors 10aa, 10ww one member of the pair is rotated 90 degrees from the other. This mating relationship therefore, requires each self retained pressure connector 10aa–10dd, 10ww–10zz in each array 50, 72 to be seated in the respective circuit board in a known and predetermined orientation such that the 90 degree relationship between the mating pair may be provided.

By providing a mating arrangement between two self retained pressure connectors, full surface pads may be completely eliminated from the interconnection system. As a result, capacitive effects of a traditional surface pad are likewise eliminated.

It will be appreciated by those of ordinary skill in the art that the particular shape and features of the self retained pressure connector may be varied somewhat while still providing the benefits described herein.

Figure 13:
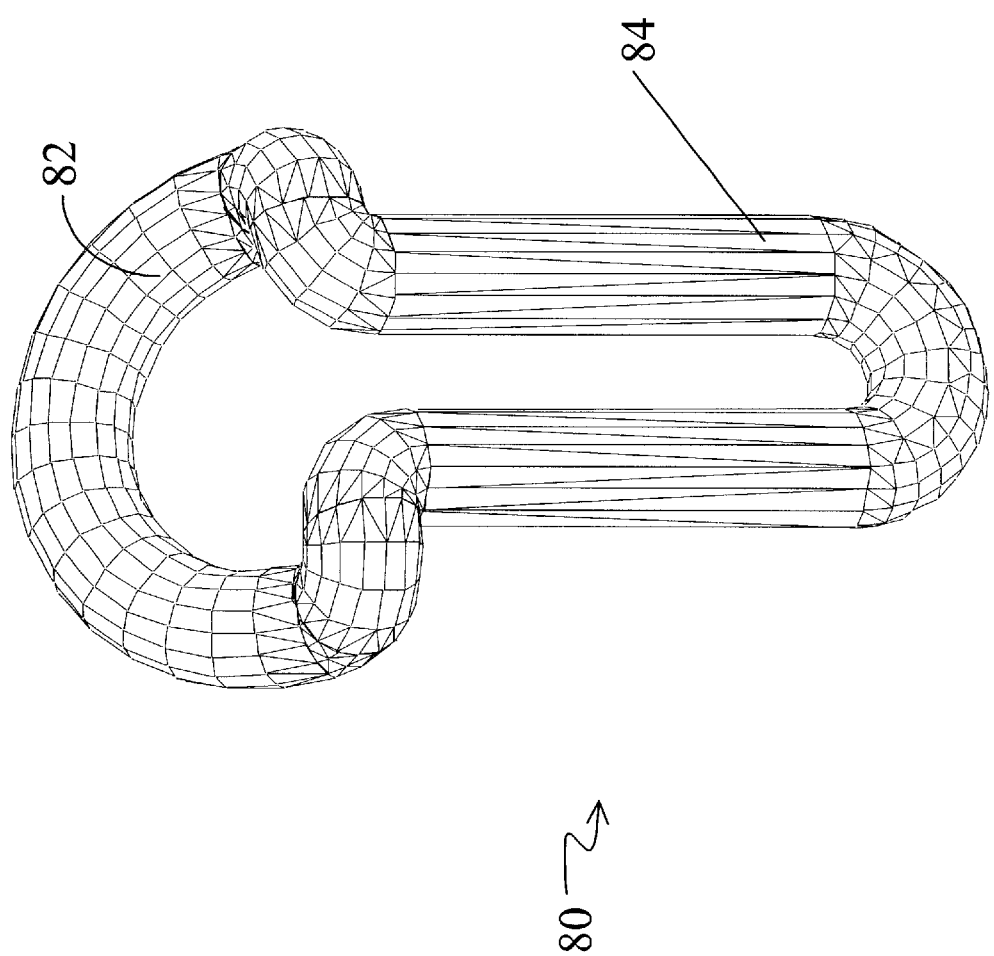
FIG. 13 is an illustration of a self retained pressure connector according to a second embodiment of the invention.

Referring now to FIG. 13, a second embodiment of a self retained pressure connector 80 is shown to include a single surface contact 82. An insertion element 84 is provided at an end opposing the end including the surface contact 82. The surface contact 82 is provided with a bend in it to provide a spring action to the contact 82 when a downward force is applied against the surface contact 82.

Figure 14:
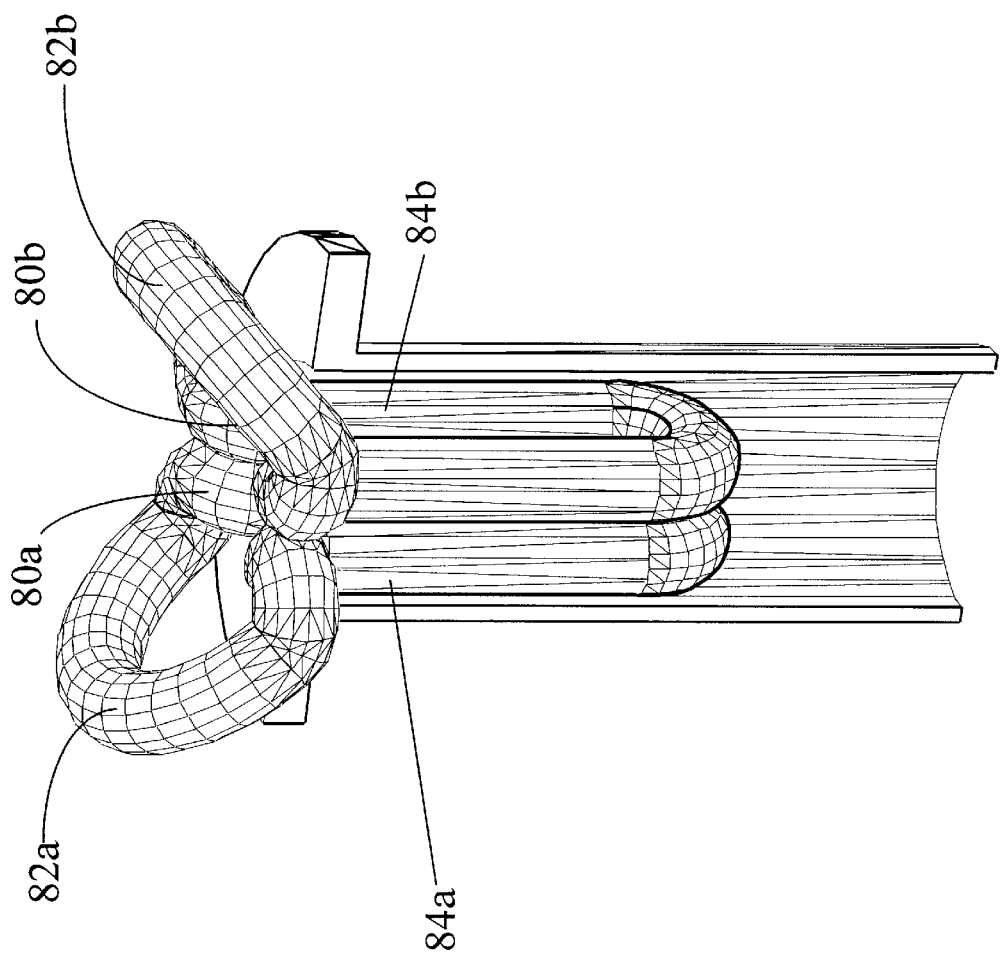
FIG. 14 depicts a pair of the self retained pressure connectors of FIG. 13 inserted into a plated through hole.

Here, the self retained pressure connector 80 is formed from a wire-like piece or strand of high strength, conductive material, preferably having suitable spring characteristics and providing a conductivity typical of dry circuit connections in the miliamp range. In a preferred embodiment, a pair of self retained pressure connectors 80a, 80b are inserted into a plated through hole as shown in FIG. 14. With such an arrangement, multiple points of contact 82a, 82b are provided, thus increasing the likelihood of a reliable electrical connection through the self retained pressure connector.

When a downward force is applied to the self retained pressure connectors 80a, 80b, the surface contacts 82a, 82b flatten somewhat toward the surface pads of the plated through hole thus providing additional points of contact with the plated through hole.

To provide a differential signal through the pair of self retained pressure connectors 80a, 80b dielectric material (not shown) is provided between the pair 80a, 80b. The dielectric material electrically isolates a first connector 80a from a second connector 80b thus providing a means to transfer a differential signal. The dielectric material may be a sheet which is laminated between the two connectors 80a, 80b or may be provided through a molding operation.

Figure 15:
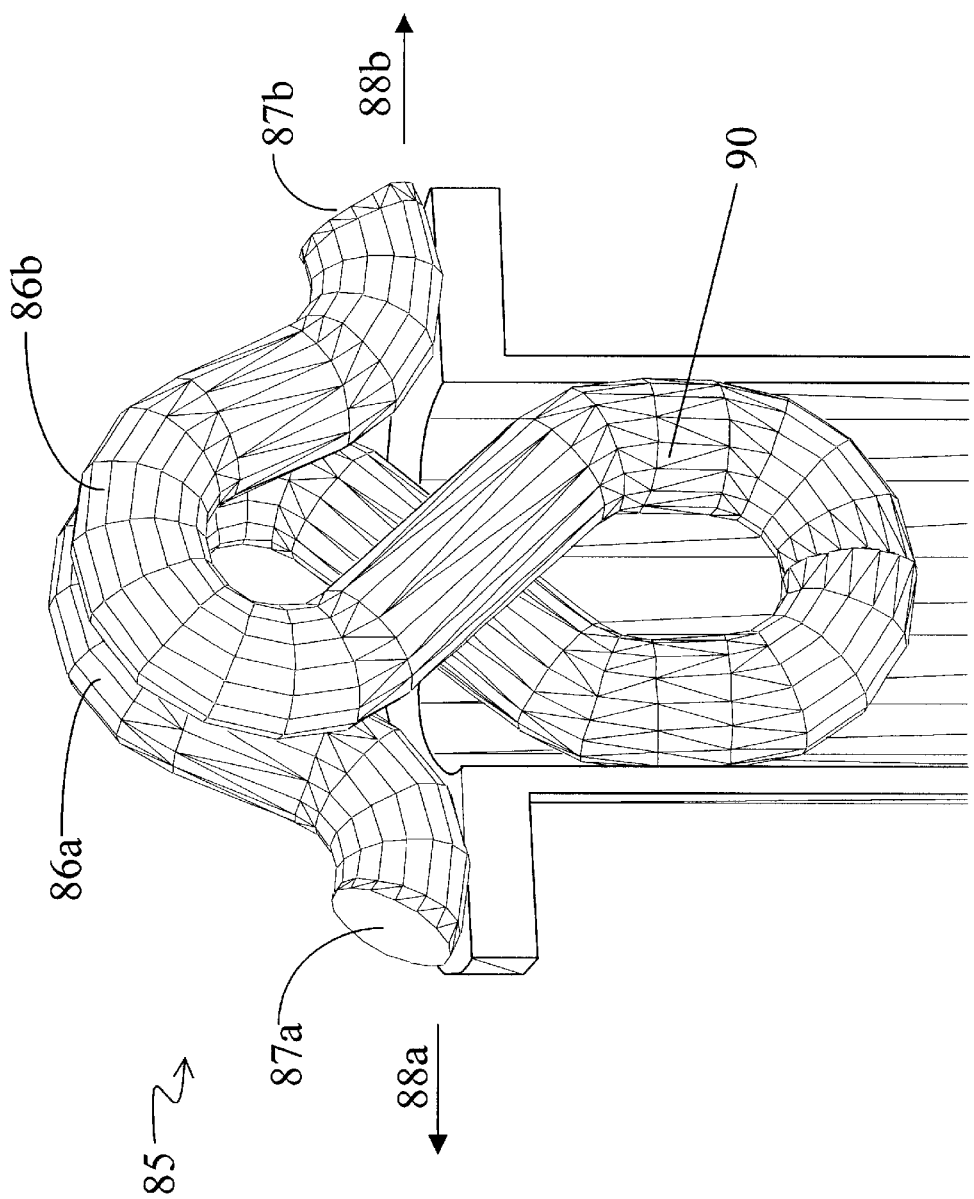
FIG. 15 is an illustration of a self retained pressure connector according to a third embodiment of the invention shown inserted into a plated through hole.

Referring now to FIG. 15, a third embodiment of a self retained pressure connector 85 is shown inserted into a plated through hole. This third embodiment of a self retained pressure connector 85, which resembles a mirror image pair of S's connected at the base, is also fashioned from a strand of conductive material.

The top half of each "S" in the connector provides a pair of surface contacts 86a, 86b for the connector 85. The joined bottom halves of the S's form an insertion element 90 of the connector. When a downward force is applied to the self retained pressure connector 85 the tops of the S's or surface contacts 86a, 86b flatten out, forcing the distal ends of the connector 87a, 87b along opposing lines 88a, 88b heading away from the center of the plated through hole.

Figure 16:
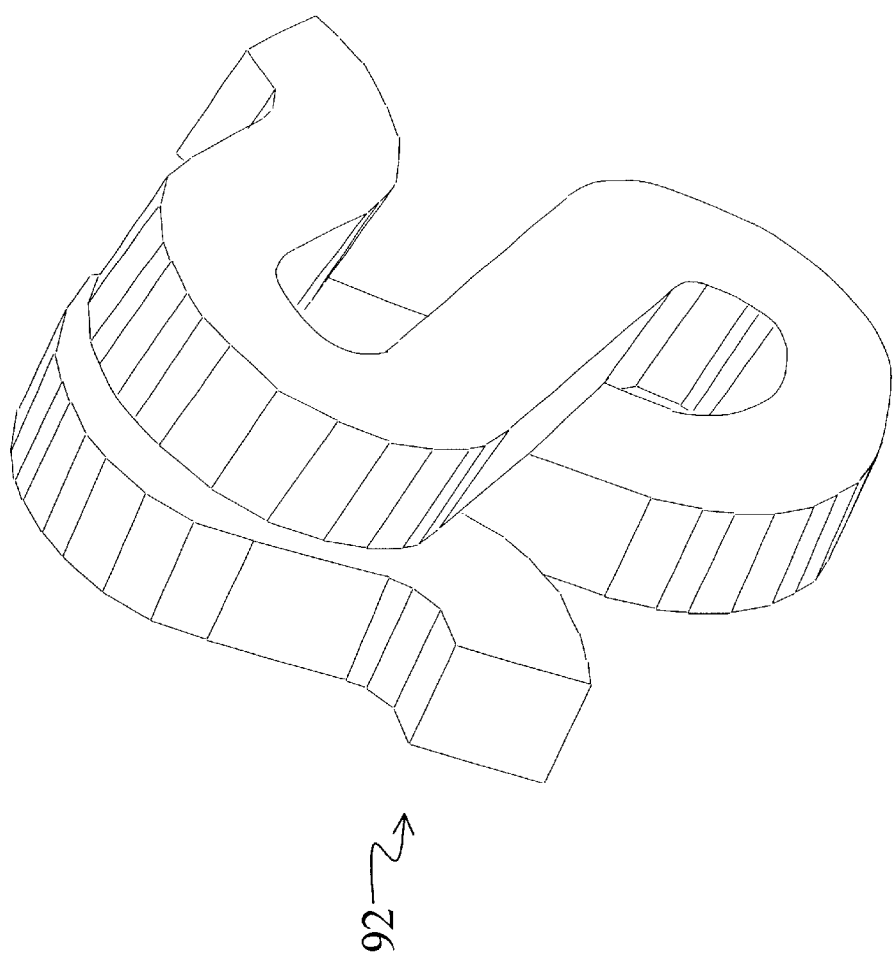
FIG. 16 is an illustration of alternate embodiment of the self retained pressure connector FIG. 15.

Referring now to FIG. 16, an alternate embodiment 92 of the self retained pressure connector of FIG. 15. is shown which is formed or stamped from a sheet of conductive material rather than from a strand of conductive material.

Having described multiple embodiments of the invention, additional variations may also be made. For example, retention teeth may also be included on the self retained pressure connector on a contact surface of the insertion element. These retention teeth provide balancing forces to counteract the forces on the connector as it is pressed into the plated through hole and further to prevent the connector from being pushed back up out of the plated through hole.

It will also be appreciated by those of ordinary skill in the art that although the preferred embodiments were described as being used in conjunction with circuit substrates, the self retained pressure connectors may also be used, for instance, by molded plastic circuits, flexible hybrid circuits or other similar medium.

While this invention has been particularly shown and described with references to preferred embodiments thereof, it will be understood by those skilled in the art that various changes in form and details may be made therein without departing from the scope of the invention encompassed by the appended claims.

What is claimed is:

1. An electrical connector adapted for use to make an electrical interconnect between a surface of a first substrate having a conductive region thereon and a conductive wall within an opening of a second substrate, the electrical connector comprising:

a spring action, surface contact at a first end, the contact having a contact region biased in a first direction and adapted for making electrical connection to the conductive region on said surface; and a compliant interference fit contact at a second end, having members shaped to provide compliance in a direction normal to the first direction and adapted for making electrical connection to said conductive wall within the opening.

2. The connector of claim 1 further comprising:
a bend between the surface contact and the interference fit contact.

3. The connector of claim 1 wherein the compliant interference fit contact is formed as an eye of the needle contact.

4. The connector of claim 1 wherein said electrical connector is formed from a sheet of conductive material.

5. The connector of claim 1 wherein said electrical connector is formed from a strand of conductive material.

6. The connector of claim 1 wherein the interference fit contact is formed from two opposing beams and the spring action contact is formed at a distal end of one of the opposing beams and the connector additionally comprises:
a) a second spring action contact formed at a distal end of the second of the opposing beams; and
b) a dielectric material electrically isolating the first beam from the second beam.

7. The connector of claim 1 wherein said compliant interference fit contact is supported within a conductive hole in a printed circuit board and said spring action surface contact provides an electrical connection to a conductive element disposed on a second surface.

8. The connector of claim 1 wherein the contact is formed from an elongated conducting member and the interference fit contact is formed by folding the central portion of the elongated member and the spring action contact is formed by bending a first distal end of the elongated conducting member and the contact additionally comprises
a second spring action, surface contact formed by bending a second distal end of the elongated conducting member.

9. The connector of claim 8 wherein said surface contacts are coined at an edge thereof.

10. An interconnection system between a printed circuit board and a surface parallel to the printed circuit board, the interconnection system comprising:
an arrangement of conductive elements disposed on said surface; and
an arrangement of first electrical connectors, each of said electrical connectors comprising:
a compliant interference fit contact disposed at a first end of said connector, said compliant interference fit contact supported within a conductive hole in said printed circuit board; and
a spring action surface contact disposed at a second end of said connector, said spring action surface contact providing a mating force normal to the surface, thereby making an electrical connection to one of said conductive elements.

11. An interconnection system between a printed circuit board and a surface, the interconnection system comprising:
an arrangement of conductive elements disposed on said surface; and
an arrangement of first electrical connectors, each of said electrical connectors comprising:
a compliant interference fit contact disposed at a first end of said connector, said compliant interference fit contact supported within a conductive hole in said printed circuit board; and
a spring action surface contact disposed at a second end of said connector, said spring action surface contact providing an electrical connection to one of said conductive elements;
wherein said conductive elements are surface pads.

12. The interconnection system of claim 11 wherein said surface is a circuit substrate.

13. The interconnection system of claim 11 wherein said surface is a second printed circuit board.

14. An interconnection system between a printed circuit board and a surface, the interconnection system comprising:
an arrangement of conductive elements disposed on said surface; and
an arrangement of first electrical connectors, each of said electrical connectors comprising:
a compliant interference fit contact disposed at a first end of said connector, said compliant interference fit contact supported within a conductive hole in said printed circuit board; and
a spring action surface contact disposed at a second end of said connector, said spring action surface contact providing an electrical connection to one of said conductive elements;
wherein said arrangement of conductive elements are an arrangement of second electrical connectors, each of said second electrical connectors comprising:
an interference fit contact disposed at a first end of said connector, said interference fit contact supported within a conductive hole in said second surface; and
a spring action surface contact disposed at a second end of said connector, said spring action surface contact providing an electrical connection to one of said first electrical connectors.

15. The interconnection system of claim 14 wherein an orientation of said second electrical connector is rotated 90 degrees from an orientation of said first electrical connector.

16. The interconnection system of claim 14 wherein said surface is a second printed circuit board.

17. An electrical interconnection system making a plurality of electrical connections between a substrate with an upper surface having a plurality of holes formed therein with electrically conducting material on the interior surfaces of the holes and a second member having a lower surface with electrically conducting elements thereon, comprising:
a plurality of contacts formed from an elongated conducting member, each elongated conducting member formed to provide:
a) a central portion inserted into a hole, the central portion having contact surfaces spring biased against the interior surface of the hole;
b) an end extending from the hole, the end bent to provide spring force normal to the upper surface, whereby electrical connection is made between the elongated conducting member and a conducting element on the lower surface.

18. The electrical interconnection system of claim 17 wherein the end is bent into a loop.

19. The electrical interconnection system of claim 17 wherein a first end and a second end of the elongated conducting member extends from the hole and each of the first end and the second end is bent to provide spring force normal to the upper surface, whereby electrical connection is made between each end of the elongated conducting member and a conducting element on the lower surface.

20. The electrical interconnection system of claim 17 wherein the central portion is formed by bending the elongated member to provide two parallel members spring biased away from each other.

21. The electrical interconnection system of claim 20 wherein the end comprises a tab bent away from the centerline of the hole.

* * * * *